(12) United States Patent
Lin

(10) Patent No.: US 12,300,590 B2
(45) Date of Patent: May 13, 2025

(54) PACKAGE STRUCTURE AND METHOD FOR FORMING SAME

(71) Applicant: JCET GROUP CO., LTD., Wuxi (CN)

(72) Inventor: Yaojian Lin, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 591 days.

(21) Appl. No.: 17/613,050

(22) PCT Filed: May 25, 2020

(86) PCT No.: PCT/CN2020/092026
§ 371 (c)(1),
(2) Date: Nov. 20, 2021

(87) PCT Pub. No.: WO2021/143000
PCT Pub. Date: Jul. 22, 2021

(65) Prior Publication Data
US 2022/0208667 A1   Jun. 30, 2022

(30) Foreign Application Priority Data
Jan. 19, 2020   (CN) .......................... 202010060016.7

(51) Int. Cl.
*H01L 23/48* (2006.01)
*H01L 21/48* (2006.01)
(Continued)

(52) U.S. Cl.
CPC .... *H01L 23/49816* (2013.01); *H01L 21/4857* (2013.01); *H01L 21/486* (2013.01);
(Continued)

(58) Field of Classification Search
CPC ............. H01L 25/0657; H01L 25/0652; H01L 25/0655
(Continued)

(56) References Cited

U.S. PATENT DOCUMENTS 8,742,576 B2 *  6/2014  Thacker .................. H01L 25/50
                                                          174/250
9,443,824 B1 *  9/2016  We ....................... H01L 23/3114
(Continued)

FOREIGN PATENT DOCUMENTS

| CN | 102169842 A | 8/2011 |
|---|---|---|
| CN | 102254897 A | 11/2011 |
| JP | 2005-317704 A | 11/2005 |

*Primary Examiner* — Nitin Parekh
(74) *Attorney, Agent, or Firm* — MUNCY, GEISSLER, OLDS & LOWE, P.C.

(57) ABSTRACT

The present invention discloses a package structure and a method for forming the same. The package structure includes a substrate, a chip, a first plastic package layer and a support block, wherein the substrate includes a first surface and a second surface; the chip is disposed on the first surface; the first plastic package layer is disposed on the first surface and packages the chip; the support block is disposed on the second surface; and in a thickness direction of the substrate, an overlapping region exists between the chip and the support block, and a thermal expansion coefficient of the chip is equal to a thermal expansion coefficient of the support block. The support block can counteract part of stress to avoid problems such as warping or twisting. Due to the overlapping region, a counteraction function of the support block on the stress exerted on the chip can be improved.

10 Claims, 8 Drawing Sheets

(51) Int. Cl.
  *H01L 21/56* (2006.01)
  *H01L 23/00* (2006.01)
  *H01L 23/29* (2006.01)
  *H01L 23/31* (2006.01)
  *H01L 23/498* (2006.01)

(52) U.S. Cl.
  CPC ......... *H01L 21/561* (2013.01); *H01L 23/293* (2013.01); *H01L 23/3128* (2013.01); *H01L 23/49822* (2013.01); *H01L 23/49838* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2924/30205* (2013.01); *H01L 2924/3511* (2013.01); *H01L 2924/3512* (2013.01)

(58) Field of Classification Search
  USPC ................................................ 257/723, 686
  See application file for complete search history.

(56) References Cited

U.S. PATENT DOCUMENTS

| | | | |
|---|---|---|---|
| 9,859,245 B1* | 1/2018 | Chen | H01L 23/49827 |
| 11,387,214 B2* | 7/2022 | Wang | H01L 23/5386 |
| 11,476,200 B2* | 10/2022 | Shih | H01L 21/4853 |
| 2013/0075922 A1 | 3/2013 | Huang et al. | |
| 2014/0299999 A1* | 10/2014 | Hu | H01L 21/561 |
| | | | 257/774 |
| 2014/0360767 A1* | 12/2014 | Terui | H01L 24/19 |
| | | | 174/261 |
| 2015/0028486 A1* | 1/2015 | Liu | H01L 23/5389 |
| | | | 257/773 |
| 2016/0085899 A1* | 3/2016 | Qian | H01L 21/4857 |
| | | | 257/774 |
| 2018/0040531 A1 | 2/2018 | Lin et al. | |
| 2018/0151477 A1* | 5/2018 | Yu | H01L 24/20 |
| 2018/0301418 A1* | 10/2018 | Chang Chien | H01L 23/3135 |
| 2020/0266149 A1* | 8/2020 | Xu | H01L 21/56 |

* cited by examiner

PACKAGE STRUCTURE AND METHOD FOR FORMING SAME

CROSS-REFERENCE TO RELATED APPLICATION

The present application is a 35 U.S.C. § 371 National Phase conversion of International (PCT) Patent Application No. PCT/CN2020/092026, filed on May 25, 2020, which is based on and claims priority to the Chinese Patent Application No. 202010060016.7, filed on Jan. 19, 2020 and entitled "PACKAGE STRUCTURE AND METHOD FOR FORMING SAME," the disclosure of which is incorporated herein by reference in its entirety. The PCT International Patent Application was filed and published in Chinese.

TECHNICAL FIELD

The present invention relates to the field of package technologies, and in particular, to a package structure and a method for forming the same.

BACKGROUND

A fan-out package technology is to place chips on another substrate and then perform a package process, so that there are relatively wide distances between these chips. Pads on the chips are allocated appropriately; a lateral extending redistribution manner is configured to implement plastic packaging of a fan-out structure of the chips; and finally, cutting is performed to acquire singulated package structures.

A fan-out package structure uses sealant to cover a silicon chip. During a temperature cycling test or an extreme temperature test, because a thermal expansion coefficient of the silicon chip differs greatly from a thermal expansion coefficient of the sealant (a thermal expansion coefficient of a silicon material is 2.3, and a thermal expansion coefficient of the sealant is between 20 and 180), an entire package structure is prone to warp and deform. In addition, inner stress is mainly exerted on a peripheral edge of the silicon chip. As a result, the peripheral edge is prone to crack.

SUMMARY

Objectives of the present invention are to provide a package structure and a method for forming the same, which can prevent the package structure from warping.

To implement one of the above inventive objectives, an embodiment of the present invention provides a package structure, including:
  a substrate, including a first surface and a second surface opposite to each other;
  a chip, disposed on the first surface;
  a first plastic package layer, disposed on the first surface and configured to package the chip; and
  a support block, disposed on the second surface,
  wherein in the thickness direction of the substrate, an overlapping region exists between the chip and the support block, and a thermal expansion coefficient of the chip is equal to a thermal expansion coefficient of the support block.

As a further improvement of an embodiment of the present invention, the package structure includes a plurality of chips that are disposed on the first surface and distributed at intervals, wherein a gap exists between adjacent chips; and the support block is disposed at least corresponding to two ends of the gap.

As a further improvement of an embodiment of the present invention, the support block is further disposed corresponding to one or more of another region of the gap, an extension region of the gap, a corner region of the chip, an edge region of the chip, a corner region of the first plastic package layer, and an edge region of the first plastic package layer.

As a further improvement of an embodiment of the present invention, the substrate is a first redistribution stack layer, wherein the first redistribution stack layer includes a first electrical connection part disposed on the first surface and a second electrical connection part disposed on the second surface; the chip is electrically connected to the first electrical connection part; the support block is provided with an electrical connection structure; and the electrical connection structure is connected to the second electrical connection part.

As a further improvement of an embodiment of the present invention, the electrical connection structure is a distribution structure and/or a first copper pillar.

As a further improvement of an embodiment of the present invention, the package structure further includes a second copper pillar connected to the second electrical connection part, and a second plastic package layer, wherein the second plastic package layer is disposed on the second surface and packages the second copper pillar and the support block.

As a further improvement of an embodiment of the present invention, at least part of an outer peripheral edge of the package structure is exposed out of the second plastic package layer.

As a further improvement of an embodiment of the present invention, the package structure further includes an implant ball, wherein the implant ball is connected to the second copper pillar, or the implant ball is connected to the second copper pillar and/or the electrical connection structure of the support block via a second redistribution stack layer.

As a further improvement of an embodiment of the present invention, the package structure further includes a dielectric layer disposed on the side, distal from the second surface, of the second plastic package layer; and part of the region of the implant ball is exposed out of the dielectric layer.

As a further improvement of an embodiment of the present invention, the package structure further includes an assistant chip disposed on the first surface.

As a further improvement of an embodiment of the present invention, the package structure further includes a protection layer disposed on the side, distal from the first surface, of the first plastic package layer, wherein the protection layer is disposed corresponding to an edge of the chip.

As a further improvement of an embodiment of the present invention, the package structure further includes an underfill structure, wherein the underfill structure is disposed between the chip and the first surface in a filling manner; and the underfill structure extends to a peripheral edge of the chip.

To implement one of the above inventive objectives, an embodiment of the present invention provides a method for forming a package structure, including:
  forming grooves in a carrier substrate, wherein a support block exists between adjacent grooves;

forming, in each groove, a second copper pillar and a second plastic package layer packaging the second copper pillar, and thinning the second plastic package layer to expose a surface of the second copper pillar;

forming, above the carrier substrate, a first redistribution stack layer communicated to the second copper pillar;

configuring a chip above the first redistribution stack layer, wherein in the thickness direction of the carrier substrate, an overlapping region exists between the chip and the support block, and a thermal expansion coefficient of the chip is equal to a thermal expansion coefficient of the support block;

forming a first plastic package layer packaging the chip;

thinning the carrier substrate to expose the second copper pillar and the support block, and forming an implant ball communicated to the second copper pillar; and performing cutting to form a plurality of independent package structures.

As a further improvement of an embodiment of the present invention, the step "forming the grooves in the carrier substrate, wherein the support block exists between the adjacent grooves" specifically includes:

forming, in part of region of the carrier substrate, an electrical connection structure to be used as the support block, and forming the grooves in the remaining part of the region of the carrier substrate.

Compared with the prior art, the present invention has the following benefits. According to the embodiment of the present invention, the thermal expansion coefficient of the first plastic package layer differs greatly from the thermal expansion coefficient of the chip. As a result, the entire package structure is prone to warp and deform. However, the thermal expansion coefficient of the support block is equal to the thermal expansion coefficient of the chip, and the support block and the chip are disposed on the two sides of the substrate. In this way, the support block can counteract part of stress exerted on the chip or between chips, thereby avoiding problems such as warping or twisting caused by different thermal shrinkage. In addition, due to the overlapping region between the chip and the support block, a counteraction function of the support block on the stress exerted on the chip is improved, that is, the support block can perform a warp balancing function.

DETAILED DESCRIPTION

The present invention will be described in detail below with reference to the specific embodiments shown in the accompanying drawings. However, these embodiments are not intended to limit the present invention. All modifications in structures, methods, or functions made by those of ordinary skill in the art according to these embodiments are included in the protection scope of the present invention.

In each figure of the present invention, to facilitate illustration, sizes of some structures or parts may be exaggerated relative to those of other structures or parts. Therefore, the figures are merely used for showing the basic structure of the subject of the present invention.

In addition, the terms "on", "above", "below", and the like that denote spatial relative positions and are used in the description describe the relationship of a unit or feature relative to another unit or feature in the accompanying drawings for the purpose of illustration, but are not limited thereto.

Figure 1:
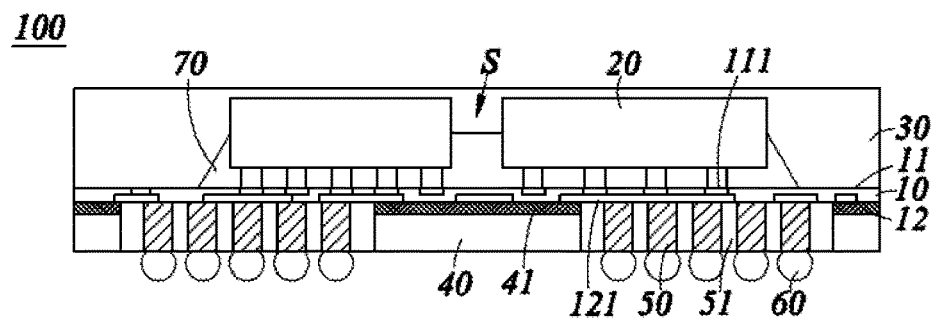
FIG. 1 is a sectional view of a package structure according to a first embodiment of the present invention.

FIG. 1 is a schematic diagram of a package structure 100 according to a first embodiment of the present invention.

The package structure 100 includes a substrate 10, a chip 20, a first plastic package layer 30, and a support block 40.

The substrate 10 includes a first surface 11 and a second surface 12 opposite to each other.

The chip 20 is disposed on the first surface 11.

The first plastic package layer 30 is disposed on the first surface 11 and packages the chip 20.

The support block 40 is disposed on the second surface 12.

In the thickness direction of the substrate 10, an overlapping region exists between the chip 20 and the support block 40, and the thermal expansion coefficient of the chip 20 is equal to the thermal expansion coefficient of the support block 40.

Herein, "package" means that the first plastic package layer 30 covers at least a peripheral edge region of the chip 20. In some embodiments, the first plastic package layer 30 may further cover a region above the chip 20. In some other embodiments, the first plastic package layer 30 exposes the region above the chip 20. For example, some heat radiation structures may be disposed above the chip 20. "In the thickness direction of the substrate 10, the overlapping region exists between the chip 20 and the support block 40" means that in the thickness direction of the substrate 10, the overlapping region exists between a vertical projection of the chip 20 on the first surface 11 and a vertical projection of the support block 40 on the first surface 11. "The thermal expansion coefficient of the chip 20 is equal to the thermal expansion coefficient of the support block 40" means that the thermal expansion coefficient of a main material of the chip 20 is approximately equal to the thermal expansion coefficient of a main material of the support block 40. Certainly, there may be some differences between the two thermal expansion coefficients, and the thermal expansion coefficients are not restricted to exact equality. That is, the thermal expansion coefficient of the chip 20 approximates to the thermal expansion coefficient of the support block 40. For example, at room temperature, the thermal expansion coefficient of the material of the support block 40 is less than 10 ppm/K. The material of the support block 40 may be monocrystal silicon, polysilicon, glass, a non-conductive filler, a composite material of fiber and resin, or a reconstruction block composed of a silicon chip and a molding compound, or the like. An initial plate of the support block 40 may be round, square, rectangular, or the like.

According to this embodiment, the thermal expansion coefficient of the first plastic package layer 30 differs greatly from the thermal expansion coefficient of the chip 20. As a result, the entire package structure 100 is prone to warp and deform. However, the thermal expansion coefficient of the support block 40 is equal to the thermal expansion coefficient of the chip 20, and the support block 40 and the chip 20 are disposed on the two sides of the substrate 10. In this way, the support block 40 can counteract part of stress exerted on the chip 20 or between chips 20, thereby avoiding problems such as warping or twisting caused by different thermal shrinkage. In addition, due to the overlapping region between the chip 20 and the support block 40, a counteraction function of the support block 40 on the stress exerted on the chip 20 is improved, that is, the support block 40 can perform a warp balancing function.

In this embodiment, the chip 20 is a silicon chip, and the support block 40 is also made of a silicon material. In this way, it can be ensured that the thermal expansion coefficient of the chip 20 is consistent with that of the support block 40. However, the present invention is not limited to this. In other embodiments, the support block 40 and the chip 20 may alternatively be made of other materials.

In this embodiment, the substrate 10 is a first redistribution stack layer (RDL) 10. The first redistribution stack layer 10 includes a first electrical connection part 111 disposed on the first surface 11 and a second electrical connection part 121 disposed on the second surface 12. The chip 20 is electrically connected to the first electrical connection part 111. The support block 40 is provided with an electrical connection structure 41. The electrical connection structure 41 is connected to the second electrical connection part 121.

In other words, the package structure 100 in this embodiment is a fan-out package structure, but is not limited thereto.

Herein, "the support block 40 is provided with the electrical connection structure 41" means that some electrical connection structures 41 are formed on the support block 40 via some processes but the silicon material is still the main material of the support block 40. In some examples, the thickness of the support block 40 is less than 250 microns.

Specifically, the electrical connection structure 41 is a distribution structure and/or a first copper pillar. This embodiment uses the electrical connection structure 41 including both the distribution structure and the first copper pillar as an example. In actual operation, on a surface of the support block 40, a patterned silicon micro-distribution structure may be formed as the distribution structure, and a micro copper pillar may be formed as the first copper pillar. That is, the electrical connection structure 41 may be disposed in a region above the support block 40. The electrical connection structure 41 can implement signal transmission. Subsequently, the electrical connection structure 41 may be communicated to the outside via a distribution process. Herein, the electrical connection structure 41 may alternatively be an integrated passive device (IPD) or an electrostatic discharge (ESD) protection circuit.

In this embodiment, the package structure 100 further includes a second copper pillar 50 connected to the second electrical connection part 121, and a second plastic package layer 51. The second plastic package layer 51 is disposed on the second surface 12 and packages the second copper pillar 50 and the support block 40.

Herein, the support block 40 and a plurality of second copper pillars 50 are disposed on the second surface 12 at intervals. A region of the second surface 12 that is not covered by the support block 40 and the plurality of second copper pillars 50 is covered by the second plastic package layer 51. That is, in this case, the second plastic package layer 51 is disposed in a plurality of slots defined by the support block 40 and the plurality of second copper pillars 50.

The material of the second plastic package layer 51 may be the same as or different from the material of the first plastic package layer 30, which may depend on actual requirements.

In this embodiment, the package structure 100 further includes an implant ball 60 connected to the second copper pillar 50. The implant ball 60 may be a solder ball or a copper bump with a tin cap. Herein, for example, the implant ball 60 is the solder ball. The implant ball 60 derives a signal of the chip 20 via the second copper pillar 50 and the first redistribution stack layer 10. Subsequently, the package structure 100 may be electrically connected to another external structure (for example, a circuit board) via the implant ball 60.

In addition, the package structure 100 further includes an underfill structure 70. The underfill structure 70 is filled between the chip 20 and the first surface 11. The underfill structure 70 extends to a peripheral edge of the chip 20, or covers the back side of the chip 20.

Herein, the underfill structure 70 is, for example, an epoxy resin or an adhesive, and is configured to stably fix the chip 20 on the first surface 11. In addition, the underfill structure 70 further covers a peripheral region of the chip 20. The first plastic package layer 30 covers the outer side of the underfill structure 70.

In this embodiment, the package structure 100 includes a plurality of chips 20 that are disposed on the first surface 11 and distributed at intervals. A gap S exists between adjacent chips 20. The support block 40 is disposed at least corresponding to two ends of the gap S. The two ends of the gap S are defined as two ends of the gap S in an extending direction of the gap S.

The support block 40 is further disposed corresponding to one or more of another region of the gap S, an extension region of the gap S, a corner region of the chip 20, an edge region of the chip 20, a corner region of the first plastic package layer 30, and an edge region of the first plastic package layer 30. Comprehensively considering an easy-to-warp region, a disposing space of the second surface 12, and other factors, a position and quantity of the support block 40 may have various distribution forms.

Specifically, FIG. 2*a* to FIG. 2*f* show different distribution forms of the support block 40. However, a distribution form of the support block 40 is not limited to the distribution forms in FIG. 2*a* to FIG. 2*f*.

Herein, a simplified schematic diagram is configured to describe a relative location relationship of the chip 20, the first plastic package layer 30 and the support block 40. For ease of description, the chip 20, the first plastic package layer 30 and the support block 40 are all vertically projected onto the same plane.

Figure 2A:
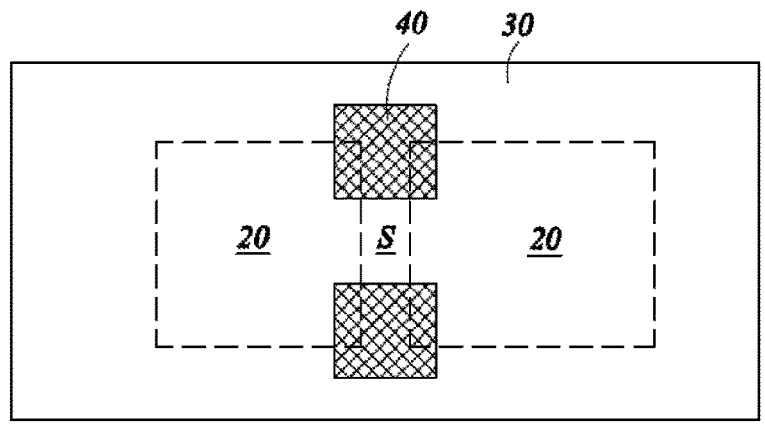
FIG. 2a to FIG. 2f are schematic diagrams of different distribution forms of support blocks according to an embodiment of the present invention.

Referring to FIG. 2*a*, the package structure 100 includes two support blocks 40 that are distributed at an interval. The support blocks 40 are disposed corresponding to two ends of the gap S. The two ends of the gap S are defined as regions above and below the gap S. The support block 40 in the region above the gap S is disposed corresponding to two corners, near the gap S, of two chips 20. Overlapping regions exist between the support block 40 and the two corners. For description of the support block 40 in the region below the gap S, refer to the description of the support block 40 in the region above the gap S. Details are not repeated herein.

Herein, the corner region of the chip 20 is a region most prone to warp. In addition, due to mutual influence between the chips 20, adjacent corner regions are more prone to warp and crack. Therefore, disposing the support blocks 40 corresponding to these regions can effectively improve an anti-warping effect, and prevent the chips 20 from cracking.

Figure 2B:
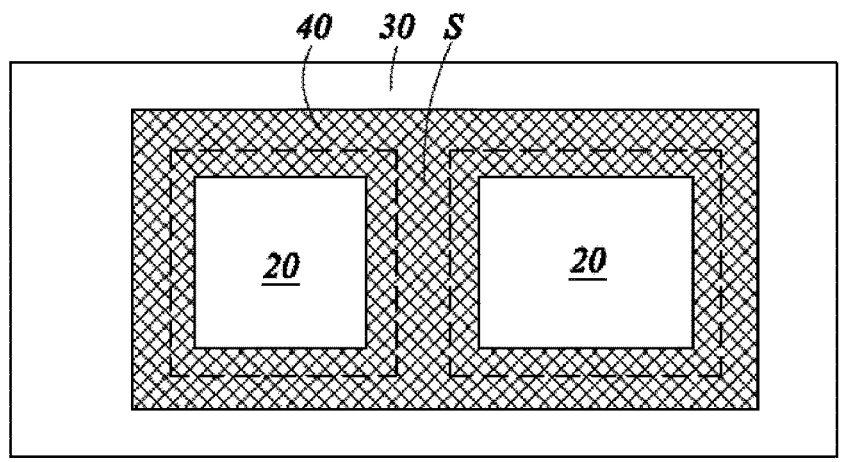

Referring to FIG. 2b, the support blocks 40 are continuously distributed. "Continuously distributed" means that the support blocks 40 are approximately connected together. The support blocks 40 may be an integrated support block 40, or may be acquired by splicing a plurality of support blocks 40. The support blocks 40 are disposed corresponding to all the edge regions of the chips 20, and corresponding to the entire gap S. Overlapping regions exist between the support blocks 40 and edges of the chips 20.

Herein, the edge region of the chip 20 is also a region that is prone to warp. Therefore, disposing the support blocks 40 corresponding to all edge regions of the chips 20 can effectively improve the anti-warping effect, thereby further protecting the edge regions of the chips 20.

Figure 2C:
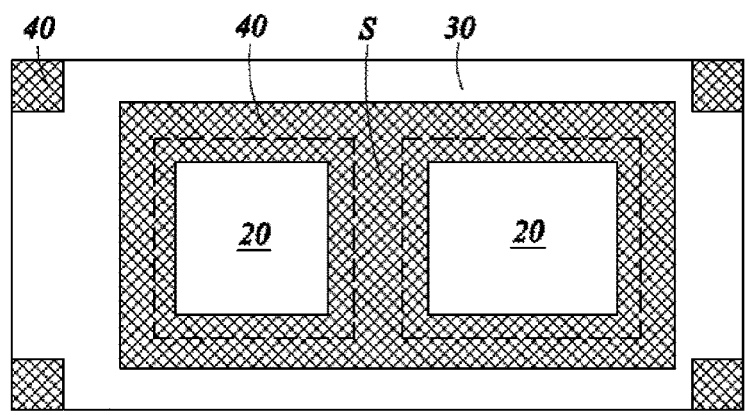

Compared with FIG. 2b, a support block 40 corresponding to a corner region of the first plastic package layer 30 is further added in FIG. 2c.

Herein, from the perspective of the entire package structure 100, a corner region of the entire package structure 100 is a region most prone to warp. Therefore, disposing the support block 40 corresponding to the corner region of the first plastic package layer 30 can improve the anti-warping effect of the entire package structure 100.

Figure 2D:
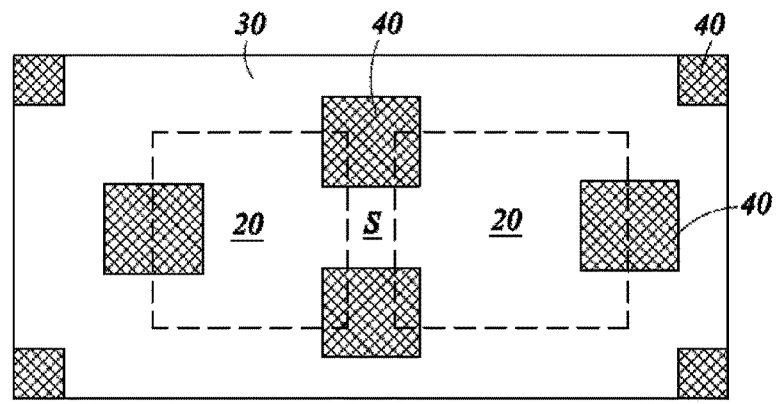

Referring to FIG. 2d, the support blocks 40 are disposed corresponding to the two ends of the gap S, the edge region of the chip 20, and the corner region of the first plastic package layer 30. Compared with the distribution form of the support blocks 40 in FIG. 2c, the distribution form in FIG. 2d can reduce space of the second surface 12 occupied by the support blocks 40 on the premise that the anti-warping effect is guaranteed.

Figure 2E:
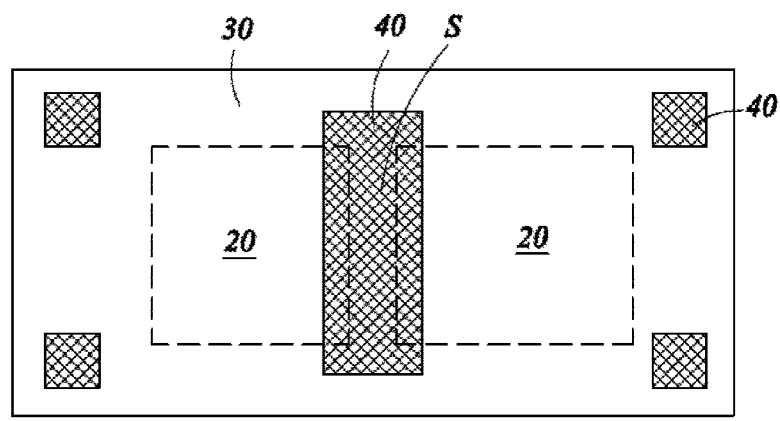

Referring to FIG. 2e, the support blocks 40 are disposed corresponding to the entire gap S and the corner region of the first plastic package layer 30.

Figure 2F:
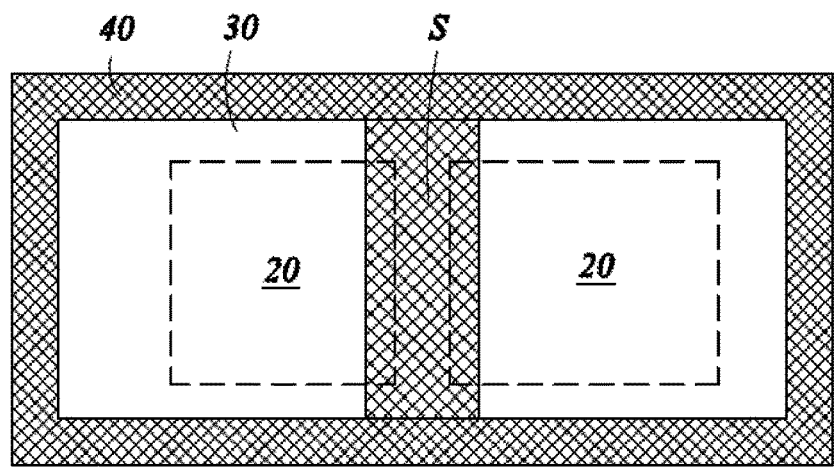

Referring to FIG. 2f, the support blocks 40 are disposed corresponding to the entire gap S, the extension region of the gap S, and the entire edge region of the first plastic package layer 30.

The following describes another embodiment of the package structure 100. For ease of description, a structure that is in this embodiment and the same as or similar to the structure in the first embodiment uses the same or similar name and number.

Figure 3:
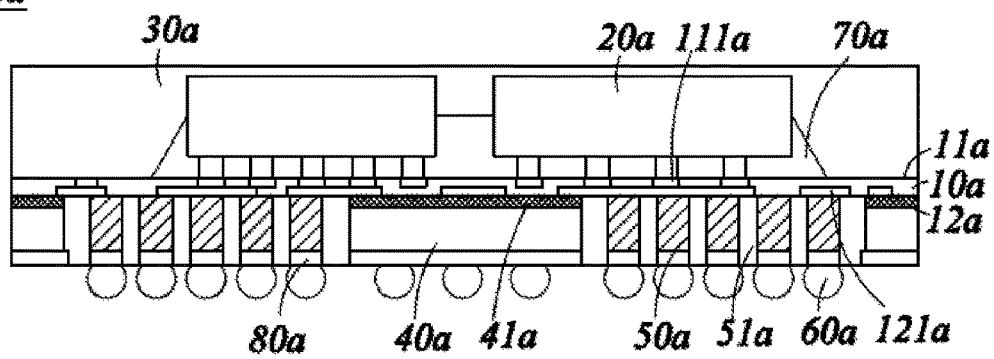
FIG. 3 is a sectional view of a package structure according to a second embodiment of the present invention.

In a second embodiment, with reference to FIG. 3, the package structure 100a includes a first redistribution stack layer 10a, a chip 20a, a first plastic package layer 30a, a support block 40a, a second copper pillar 50a, a second plastic package layer 51a, an implant ball 60a, an underfill structure 70a, and a second redistribution stack layer 80a.

The first redistribution stack layer 10a includes a first surface 11a and a second surface 12a opposite to each other. The first surface 11a is provided with a first electrical connection part 111a. The second surface 12a is provided with a second electrical connection part 121a.

The chip 20a is disposed on the first surface 11a. The chip 20a is electrically connected to the first electrical connection part 111a. The underfill structure 70a is disposed between the chip 20a and the first surface 11a. The underfill structure 70a is disposed around a peripheral edge of the chip 20a. The first plastic package layer 30a is disposed on the first surface 11a and covers the outer side of the underfill structure 70a.

The support block 40a, the second copper pillar 50a and the second plastic package layer 51a are all disposed on one side of the second surface 12a. The support block 40a is provided with an electrical connection structure 41a electrically connected to the second electrical connection part 121a. The second copper pillar 50a is electrically connected to the second electrical connection part 121a. The second redistribution stack layer 80a is formed below the support block 40a and the second copper pillar 50a. The implant ball 60a is connected to the second copper pillar 50a and/or the electrical connection structure 41a of the support block 40a via the second redistribution stack layer 80a. Herein, for example, the implant ball 60a is connected to the second copper pillar 50a and the electrical connection structure 41a of the support block 40a via the second redistribution stack layer 80a.

In other words, in this case, a signal of the chip 20a can be transmitted to the outside not only via the first redistribution stack layer 10a, the second copper pillar 50a, the second redistribution stack layer 80a and the implant ball 60a, but also via the first redistribution stack layer 10a, the electrical connection structure 41a, the second redistribution stack layer 80a and the implant ball 60a. Owning to the disposing of the second redistribution stack layer 80a, rational distribution of an output terminal can be further implemented. In addition, the second redistribution stack layer 80a covers a region of the support block 40a, which can further enlarge a region that can be electrically connected.

Figure 4:
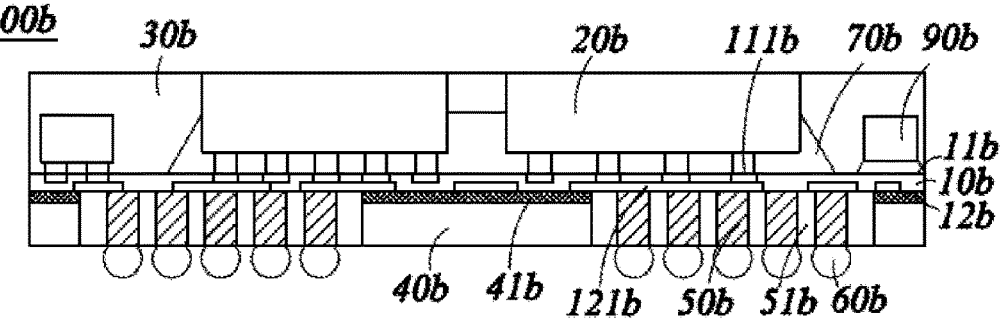
FIG. 4 is a sectional view of a package structure according to a third embodiment of the present invention.

In a third embodiment, with reference to FIG. 4, the package structure 100b includes a first redistribution stack layer 10b, a chip 20b, a first plastic package layer 30b, a support block 40b, a second copper pillar 50b, a second plastic package layer 51b, an implant ball 60b, an underfill structure 70b and an assistant chip 90b.

The first redistribution stack layer 10b includes a first surface 11b and a second surface 12b opposite to each other. The first surface 11b is provided with a first electrical connection part 111b. The second surface 12b is provided with a second electrical connection part 121b.

The chip 20b is disposed on the first surface 11b, and is electrically connected to the first electrical connection part 111b. The underfill structure 70b is disposed between the chip 20b and the first surface 11b, and is disposed around a peripheral edge of the chip 20b. The first plastic package layer 30b is disposed on the first surface 11b and covers the outer side of the underfill structure 70b.

The support block 40b, the second copper pillar 50b and the second plastic package layer 51b are all disposed on one side of the second surface 12b. The support block 40b is provided with an electrical connection structure 41b electrically connected to the second electrical connection part 121b. The second copper pillar 50b is electrically connected to the second electrical connection part 121b. The implant ball 60b is connected to the second copper pillar 50b.

The assistant chip 90b is disposed on the first surface 11b.

Herein, the assistant chip 90b is, for example, an ESD protection device, a passive device, a dummy wafer, or the like.

The ESD protection device such as a diode and an inductance/capacitance circuit, for example, can provide ESD protection. The passive device is, for example, an IPD chip, a resistor, a capacitor, an inductor, a converter, a fader, a matching network, a resonator, or a filter. The ESD protection device and the passive device are electrically connected to the first electrical connection part 111b.

The dummy wafer may be a dummy silicon wafer, or a composite laminated structural sheet, for example, a non-functional element or a simple structural member. The dummy wafer may be disposed on the first surface 11b in a patching or flip manner.

It may be understood that, the assistant chip 90b can share part of stress exerted by the first plastic package layer 30b on the chip 20b or part of stress generated between chips 20b, thereby further improving an anti-warping effect. In addition, the ESD protection device may also have an ESD protection function. The material of the dummy wafer is the same as or similar to the material of the chip 20b. A stress and warp balancing effect can be improved by adjusting a standing height or laminated structure, or a thermal expansion coefficient.

Preferably, the assistant chip 90b is disposed on the corner region of the package structure 100b, or a large-area region of the package structure 100b without the chip 20b, thereby balancing the distribution between the chip 20b and the assistant chip 90b. Therefore, stress is not completely exerted on the chip 20b.

Figure 5:
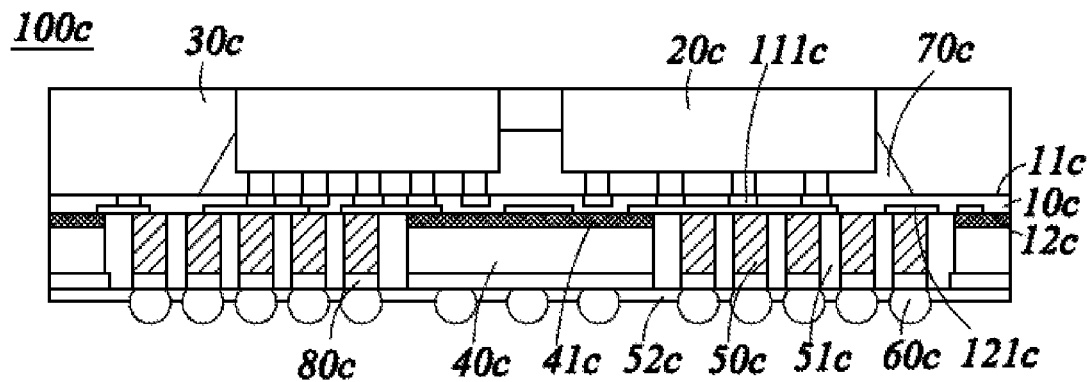
FIG. 5 is a sectional view of a package structure according to a fourth embodiment of the present invention.

In a fourth embodiment, with reference to FIG. 5, the package structure 100c includes a first redistribution stack layer 10c, a chip 20c, a first plastic package layer 30c, a support block 40c, a second copper pillar 50c, a second plastic package layer 51c, an implant ball 60c, an underfill structure 70c, a second redistribution stack layer 80c, and a dielectric layer 52c.

The first redistribution stack layer 10c includes a first surface 11c and a second surface 12c opposite to each other. The first surface 11c is provided with a first electrical connection part 111c. The second surface 12c is provided with a second electrical connection part 121c.

The chip 20c is disposed on the first surface 11c, and is electrically connected to the first electrical connection part 111c. The underfill structure 70c is disposed between the chip 20c and the first surface 11c, and is disposed around a peripheral edge of the chip 20c. The first plastic package layer 30c is disposed on the first surface 11c and covers the outer side of the underfill structure 70c.

The support block 40c, the second copper pillar 50c and the second plastic package layer 51c are all disposed on one side of the second surface 12c. The support block 40c is provided with an electrical connection structure 41c electrically connected to the second electrical connection part 121c. The second copper pillar 50c is electrically connected to the second electrical connection part 121c. The second redistribution stack layer 80c is formed below the support block 40c and the second copper pillar 50c. The implant ball 60c is connected to the second copper pillar 50c and/or the electrical connection structure 41c of the support block 40c via the second redistribution stack layer 80c. Herein, for example, the implant ball 60c is connected to the second copper pillar 50c and the electrical connection structure 41c of the support block 40c via the second redistribution stack layer 80c.

The dielectric layer 52c is disposed on the side, distal from the second surface 12c, of the second plastic package layer 51c. Part of the region of the implant ball 60c is exposed out of the dielectric layer 52c.

Herein, as a specific example, the formed final dielectric layer 52c has a higher modulus or a lower thermal expansion coefficient than the second redistribution stack layer 80c, so that the dielectric layer 52c does not affect overall balancing of the package structure 100c, and a warping problem caused again by addition of a dielectric layer 52c is avoided.

Figure 6:
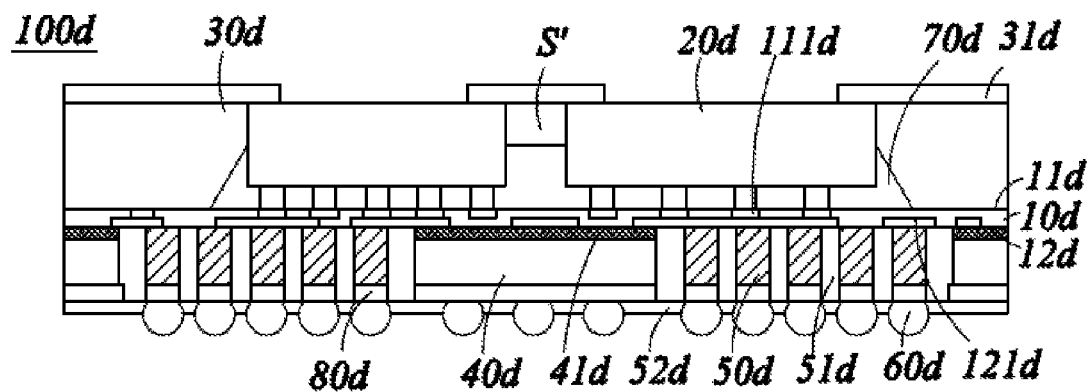
FIG. 6 is a sectional view of a package structure according to a fifth embodiment of the present invention.

In a fifth embodiment, with reference to FIG. 6, the package structure 100d includes a first redistribution stack layer 10d, a chip 20d, a first plastic package layer 30d, a support block 40d, a second copper pillar 50d, a second plastic package layer 51d, an implant ball 60d, an underfill structure 70d, a second redistribution stack layer 80d, a dielectric layer 52d and a protection layer 31d.

The first redistribution stack layer 10d includes a first surface 11d and a second surface 12d opposite to each other. The first surface 11d is provided with a first electrical connection part 111d. The second surface 12d is provided with a second electrical connection part 121d.

The chip 20d is disposed on the first surface 11d, and is electrically connected to the first electrical connection part 111d. The underfill structure 70d is disposed between the chip 20d and the first surface 11d, and is disposed around a peripheral edge of the chip 20d. The first plastic package layer 30d is disposed on the first surface 11d and covers the outer side of the underfill structure 70d.

The support block 40d, the second copper pillar 50d and the second plastic package layer 51d are all disposed on one side of the second surface 12d. The support block 40d is provided with an electrical connection structure 41d electrically connected to the second electrical connection part 121d. The second copper pillar 50d is electrically connected to the second electrical connection part 121d. The second redistribution stack layer 80d is formed below the support block 40d and the second copper pillar 50d. The implant ball 60d is connected to the second copper pillar 50d and/or the electrical connection structure 41d of the support block 40d via the second redistribution stack layer 80d. Herein, for example, the implant ball 60d is connected to the second copper pillar 50d and the electrical connection structure 41d of the support block 40d via the second redistribution stack layer 80d.

The dielectric layer 52d is disposed on the side, distal from the second surface 12d, of the second plastic package layer 51d. Part of the region of the implant ball 60d is exposed out of the dielectric layer 52d.

The protection layer 31d is disposed on the side, distal from the first surface 11d, of the first plastic package layer 30d.

Herein, the protection layer 31d is made of the same material as the first plastic package layer 30d. Alternatively, the protection layer 31d has a higher thermal expansion coefficient, modulus, or curing shrinkage rate than the first plastic package layer 30d. The protection layer 31d is, for example, a resin coated copper tape, a composite heat conductive material, or a plurality of deposited metal layers.

The protection layer 31d is disposed corresponding to an edge of the chip 20d, and the protection layer 31d corresponds to a gap S' between chips 20d. The protection layer 31d crosses the gap S' between the chips 20d and the edge of the chip 20d, thereby further protecting the edge of the chip 20d and preventing cracks between the chips 20d. Therefore, warping is balanced.

Figure 7:
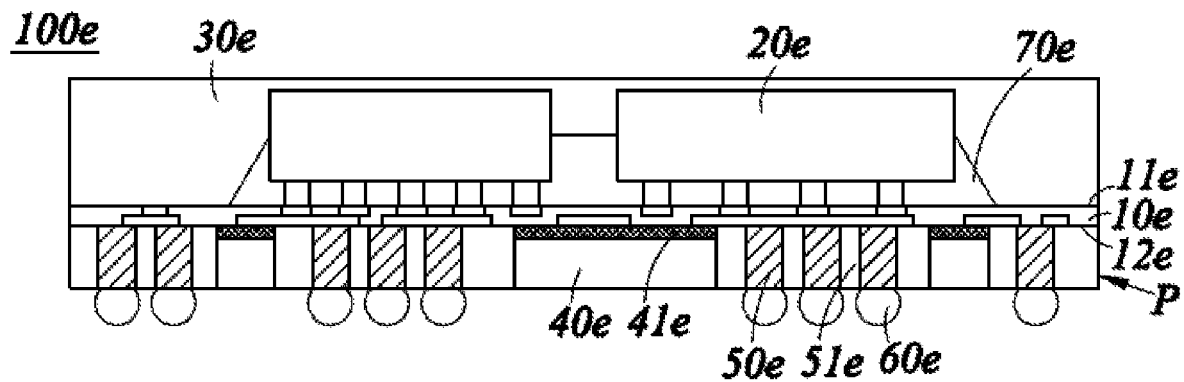
FIG. 7 is a sectional view of a package structure according to a sixth embodiment of the present invention.
Figure 8:
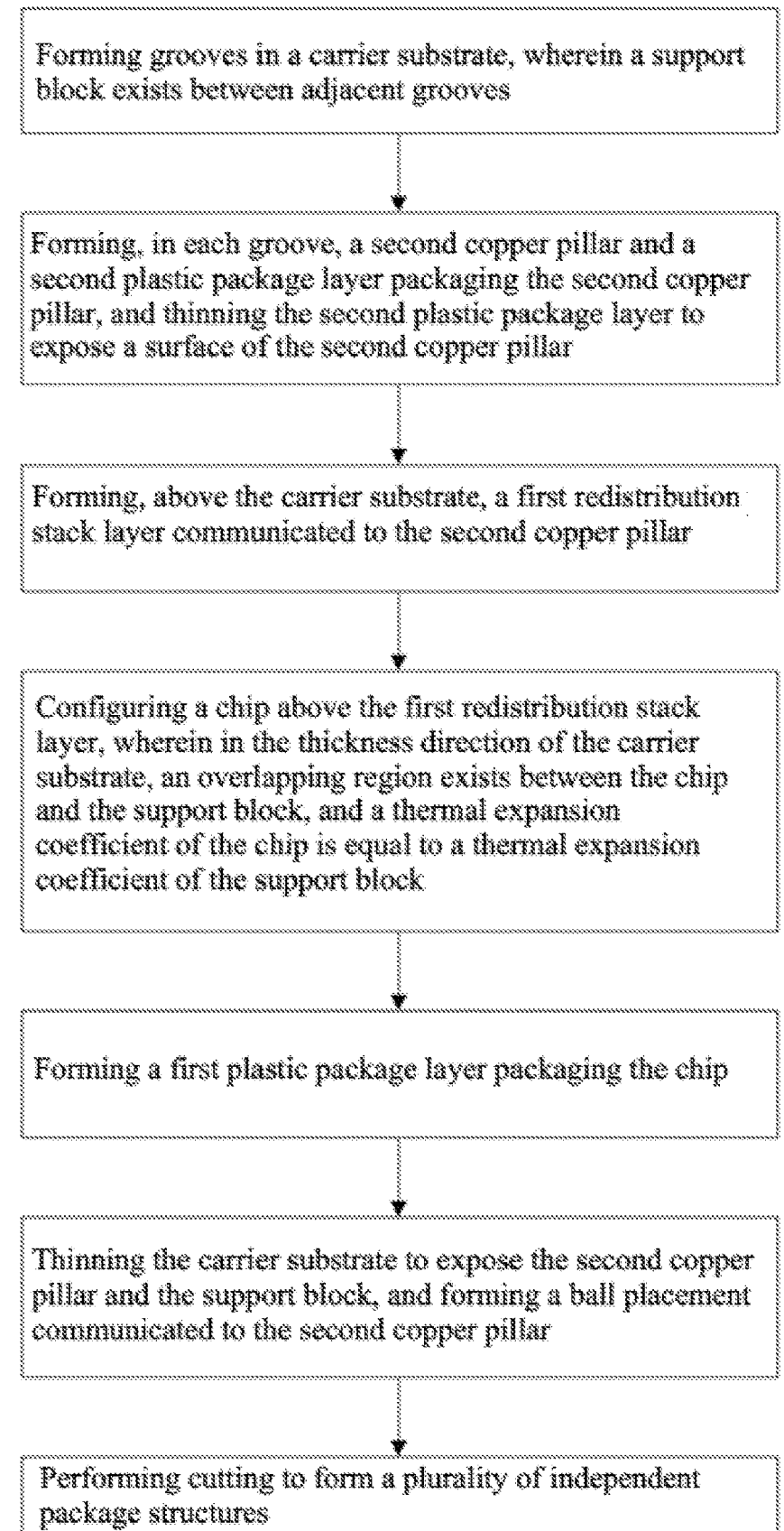
FIG. 8 is a diagram showing steps of a method for forming a package structure according to an embodiment of the present invention.

In a sixth embodiment, with reference to FIG. 7, the package structure 100e includes a first redistribution stack layer 10e, a chip 20e, a first plastic package layer 30e, a support block 40e, a second copper pillar 50e, a second plastic package layer 51e, an implant ball 60e, and an underfill structure 70e.

The first redistribution stack layer 10e includes a first surface 11e and a second surface 12e opposite to each other. The first surface 11e is provided with a first electrical connection part 111e. The second surface 12e is provided with a second electrical connection part 121e.

The chip 20e is disposed on the first surface 11e, and is electrically connected to the first electrical connection part 111e. The underfill structure 70e is disposed between the chip 20e and the first surface 11e, and is disposed around a peripheral edge of the chip 20e. The first plastic package layer 30e is disposed on the first surface 11e and covers the outer side of the underfill structure 70e.

The support block 40e, the second copper pillar 50e and the second plastic package layer 51e are all disposed on one side of the second surface 12e. The support block 40e is provided with an electrical connection structure 41e electrically connected to the second electrical connection part 121e. The second copper pillar 50e is electrically connected to the second electrical connection part 121e. The implant ball 60e is connected to the second copper pillar 50e.

According to this embodiment, at least part of an outer peripheral edge of the package structure 100e is exposed out of the second plastic package layer 51e. That is, as shown in a region P in FIG. 7, the second plastic package layer 51e in this region is exposed to the outside, which can improve an overall appearance, and avoid impact of exposure of an excessive support block 40e on electrical performance and the appearance.

FIG. 8 to FIG. 16 are schematic diagrams of a method for forming a package structure 100 according to an embodiment of the present invention.

The package structure 100 in the first embodiment is used as an example. The method for forming the package structure 100 includes the following steps.

Figure 9:
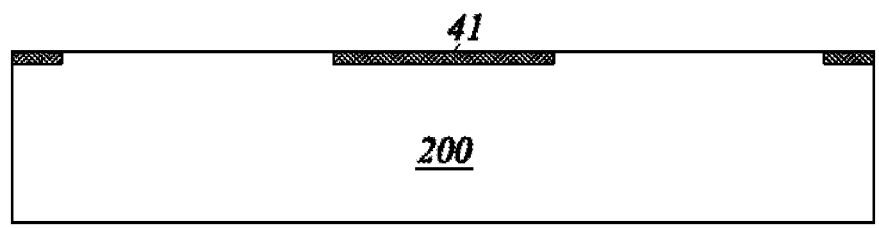
FIG. 9 to FIG. 16 are diagrams of a method for forming a package structure according to an embodiment of the present invention.
Figure 10:
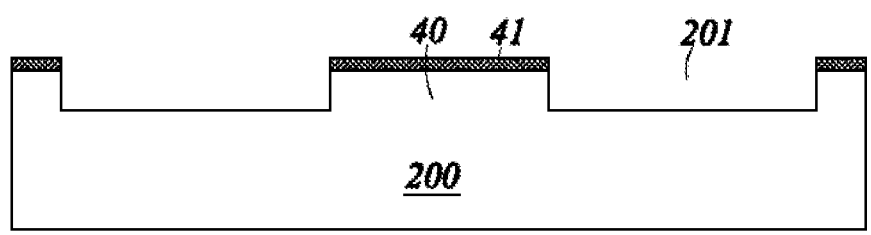

In S1, with reference to FIG. 9 and FIG. 10, grooves 201 are formed in a carrier substrate 200, wherein a support block 40 exists between adjacent grooves 201.

Herein, the carrier substrate 200 is a wafer substrate, but is not limited to this. The carrier substrate 200 may be round, square, or rectangular. The material of the support block 200 may be monocrystal silicon, polysilicon, glass, a non-conductive filler, a composite material of fiber and resin, a reconstruction block composed of a silicon chip and a molding compound, or the like.

Specifically, in this embodiment, "forming the grooves 201 in the carrier substrate 200, wherein the support block 40 exists between the adjacent grooves 201" includes:

Forming, in part of region of the carrier substrate 200, an electrical connection structure 41 to be used as the support block 40, and forming the grooves 201 in the remaining part of the region of the carrier substrate 200.

Herein, on part of the surface of the carrier substrate 200 via photoetching and electroplating production processes, a patterned silicon micro-distribution structure or a micro copper pillar may be formed as the electrical connection structure 41. In addition, part of the carrier substrate 200 may be removed by using a saw blade, laser drilling, or dry etching, to form the grooves 201 (where a region of the electrical connection structure 41 is avoided). In other embodiments, the step of forming the electrical connection structure 41 may be eliminated. That is, the grooves 201 are formed only in the carrier substrate 200, and a region of the carrier substrate 200 where the grooves 201 are not formed is used as the support plate 40.

Figure 11:
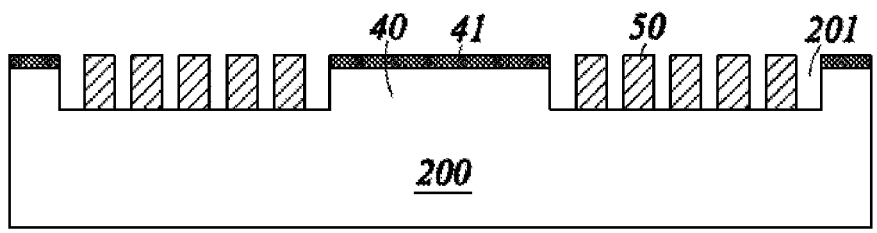
Figure 12:
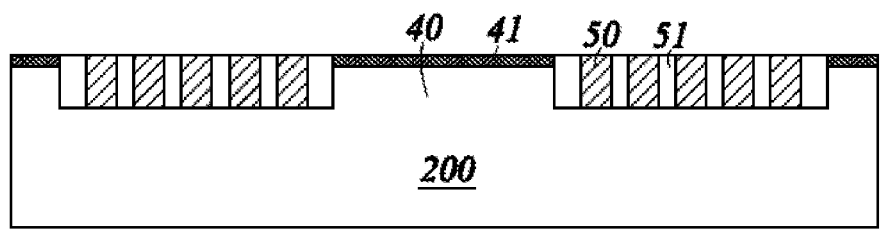

In S2, with reference to FIG. 11 and FIG. 12, a second copper pillar 50 and a second plastic package layer 51 packaging the second copper pillar 50 are formed in each groove 201, and the second plastic package layer 51 is thinned to expose a surface of the second copper pillar 50 and a surface of the electrical connection structure 41.

Herein, the second copper pillar 50 is prepared in the groove 201 via electroplating. Subsequently, the second plastic package layer 51 is formed via thermo-compression plastic package, paste printing, film-bonding plastic package, liquid sealant molding, or another method. Then, grinding and mechanical polishing are performed to expose the upper surface of the second copper pillar 50 and the upper surface of the electrical connection structure 41.

Figure 13:
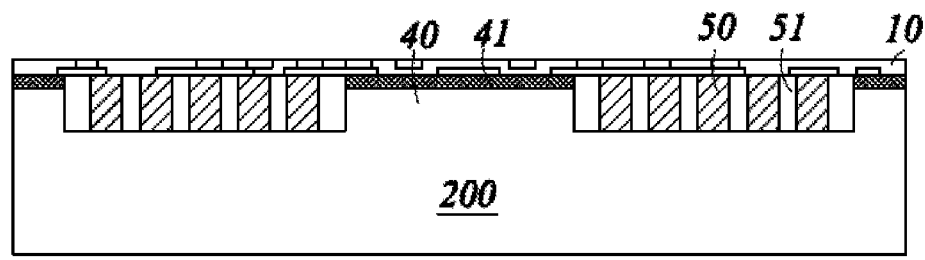

In S3, with reference to FIG. 13, a first redistribution stack layer 10 communicated to the second copper pillar 50 is formed above the carrier substrate 200.

Herein, the first redistribution stack layer 10 is formed via patterning and deposition processes.

Figure 14:
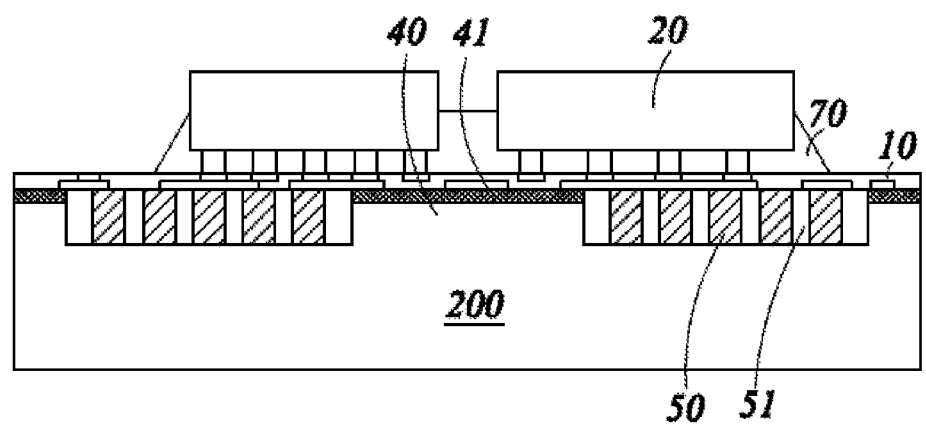

In S4, with reference to FIG. 14, a chip 20 is configured above the first redistribution stack layer 10, wherein in the thickness direction of the carrier substrate 200, an overlapping region exists between the chip 20 and the support block 40, and a thermal expansion coefficient of the chip 20 is equal to a thermal expansion coefficient of the support block 40.

Herein, the chip 20 is disposed above the first redistribution stack layer 10 via a chip-to-wafer (C2W) bonding process, which includes, for example, a mass reflow (MR) process, a thermo-compression bonding (TCB) process, an NCF-TCB non-conductive adhesive process, a hybrid DBI process, or the like. Then, an optional underfill process is performed. That is, an underfill material 70 is disposed between the chip 20 and the first redistribution stack layer 10 in a filling manner, and the underfill material 70 extends to a peripheral edge of the chip 20. The underfill material 70 is, for example, an epoxy resin or an adhesive, and is deposited between the chip 20 and the first redistribution stack layer 10 via a dispenser.

Figure 15:
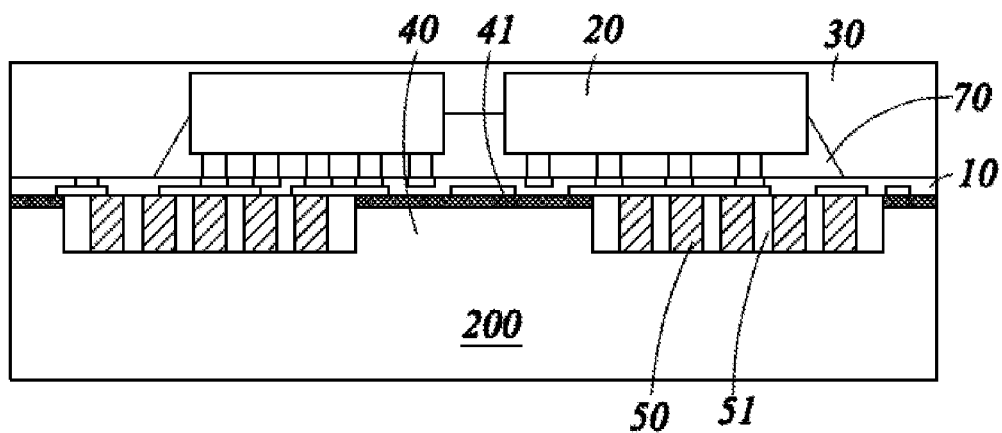

In S5, with reference to FIG. 15, a first plastic package layer 30 packaging the chip 20 is formed.

Herein, the first plastic package layer 30 is formed via thermo-compression plastic package or film-assisted transfer molding (FAM) (in which the back side of the chip is exposed).

Figure 16:
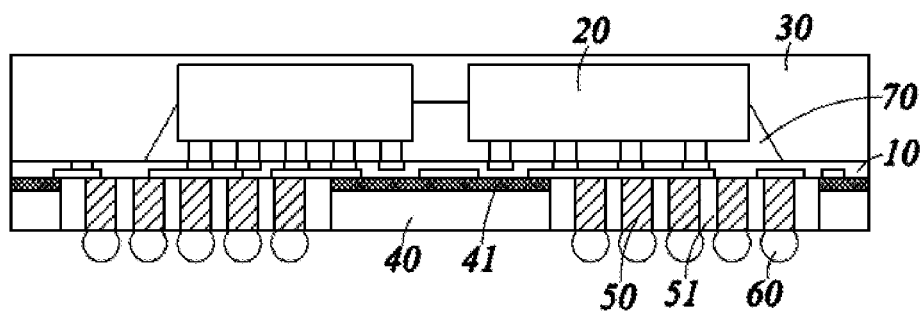

In S6, with reference to FIG. 16, the carrier substrate 200 is thinned to expose the second copper pillar 50 and the support block 40, and an implant ball 60 communicated to the second copper pillar 50 is formed.

Then, the first plastic package layer 30 is thinned as required.

Herein, front mechanical grinding for thinning and optional CMP are performed to remove part of the carrier substrate 200 and expose the second copper pillar 50 and the support block 40. Then, the implant ball 60 connected to the second copper pillar 50 is prepared. The implant ball 60 may be a solder ball or a copper bump with a tin cap.

In S7, cutting is performed to form a plurality of independent package structures 100.

According to this embodiment, the thermal expansion coefficient of the first plastic package layer 30 differs greatly from the thermal expansion coefficient of the chip 20. As a result, the entire package structure 100 is prone to warp and deform. However, the thermal expansion coefficient of the support block 40 is equal or close to the thermal expansion coefficient of the chip 20, and the support block 40 and the chip 20 are disposed on the two sides of the substrate 10. In this way, the support block 40 can counteract part of stress exerted on the chip 20 or between chips 20, thereby avoiding problems such as warping or twisting caused by different thermal shrinkage. In addition, due to the overlapping region between the chip 20 and the support block 40, a counteraction function of the support block 40 on the stress exerted on the chip 20 can be improved, that is, the support block 40 can perform a warp balancing function.

In addition, on a surface of the support block 40, a patterned silicon micro-distribution structure may be formed as the distribution structure, and a micro copper pillar may be formed as the first copper pillar. That is, the electrical connection structure 41 may be disposed in a region above the support block 40. The electrical connection structure 41 can implement signal transmission or perform ESD protection in a mounting process of the chip 20. Subsequently, the electrical connection structure 41 may be communicated to the outside via a distribution process.

For other descriptions of the method for forming the package structure 100 in this embodiment, refer to the above descriptions of the package structure 100. Details are not repeated herein.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments that can be understood by those skilled in the art.

The series of detailed illustration listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A package structure, comprising:
    a substrate, comprising a first surface and a second surface opposite to each other;
    a chip, disposed on the first surface;
    a first plastic package layer, disposed on the first surface and configured to package the chip; and
    a support block, disposed on the second surface,
    wherein in a thickness direction of the substrate, an overlapping region exists between the chip and the support block, and a thermal expansion coefficient of the chip is equal to a thermal expansion coefficient of the support block,
    wherein the substrate is a first redistribution stack layer, the package structure comprises a plurality of chips that are disposed on the first surface and distributed at intervals, and a gap exists between adjacent chips; and the support block is disposed at least corresponding to two ends of the gap,
    wherein the first redistribution stack layer comprises a first electrical connection part disposed on the first surface and a second electrical connection part disposed on the second surface, the chip is electrically connected to the first electrical connection part; the support block is provided with an electrical connection structure, and the electrical connection structure is connected to the second electrical connection part, and
    wherein the package structure further comprises a protection layer disposed on a side, distal from the first surface, wherein the protection layer is disposed corresponding to an edge of the chip.

2. The package structure according to claim 1, wherein the support block is further disposed corresponding to one or more of another region of the gap, an extension region of the gap, a corner region of the chip, an edge region of the chip, a corner region of the first plastic package layer, and an edge region of the first plastic package layer.

3. The package structure according to claim 1, wherein the electrical connection structure is a distribution structure and/or a first copper pillar.

4. The package structure according to claim 1, wherein the package structure further comprises a second copper pillar connected to the second electrical connection part, and a second plastic package layer, wherein the second plastic package layer is disposed on the second surface and packages the second copper pillar and the support block.

5. The package structure according to claim 4, wherein at least part of an outer peripheral edge of the package structure is exposed out of the second plastic package layer.

6. The package structure according to claim 4, wherein the package structure further comprises an implant ball, wherein the implant ball is connected to the second copper pillar, or is connected to the second copper pillar and/or the electrical connection structure of the support block via a second redistribution stack layer.

7. The package structure according to claim 6, wherein the package structure further comprises a dielectric layer disposed on a side, distal from the second surface, of the second plastic package layer; and part of region of the implant ball is exposed out of the dielectric layer.

8. The package structure according to claim 1, wherein the package structure further comprises an underfill structure, and the underfill structure is disposed between the chip and the first surface in a filling manner; and the underfill structure extends to a peripheral edge of the chip.

9. A method for forming a package structure according to claim 1, comprising the following steps:
    forming grooves in a carrier substrate, wherein a support block exists between adjacent grooves;
    forming, in each groove, a second copper pillar and a second plastic package layer packaging the second copper pillar, and thinning the second plastic package layer to expose a surface of the second copper pillar;
    forming, above the carrier substrate, a first redistribution stack layer communicated to the second copper pillar;
    configuring a chip above the first redistribution stack layer, wherein in a thickness direction of the carrier substrate, an overlapping region exists between the chip and the support block, and a thermal expansion coefficient of the chip is equal to a thermal expansion coefficient of the support block;
    forming a first plastic package layer packaging the chip;
    thinning the carrier substrate to expose the second copper pillar and the support block, and forming an implant ball communicated to the second copper pillar; and
    performing cutting to form a plurality of independent package structures.

10. The method according to claim 9, wherein the step "forming the grooves in the carrier substrate, wherein the support block exists between the adjacent grooves" specifically comprises:
    forming, in part of region of the carrier substrate, an electrical connection structure to be used as the support block, and forming the grooves in the remaining part of the region of the carrier substrate.

* * * * *